United States Patent [19]

Adams et al.

[11] Patent Number: 5,355,172
[45] Date of Patent: Oct. 11, 1994

[54] METHOD AND APPARATUS OF SAMPLING A REFERENCE SIGNAL

[75] Inventors: Phillip Adams; Barry D. R. Miles, both of Newbury, United Kingdom

[73] Assignee: Alpha Image Limited, England

[21] Appl. No.: 964,419

[22] Filed: Oct. 21, 1992

[30] Foreign Application Priority Data

Oct. 25, 1991 [GB] United Kingdom ............... 9122711

[51] Int. Cl.⁵ .............................................. H04N 9/44
[52] U.S. Cl. ................................... 348/505; 348/539; 348/654
[58] Field of Search .................... 358/19, 28; 348/505, 348/539, 654; H04N 9/44

[56] References Cited

U.S. PATENT DOCUMENTS

| | | | |
|---|---|---|---|
| 4,598,310 | 7/1986 | Brand | 358/19 |
| 5,067,011 | 11/1991 | Basile et al. | 358/28 X |
| 5,130,787 | 7/1992 | Ozaki et al. | 358/28 |
| 5,161,005 | 11/1992 | Harradine | 358/28 |
| 5,210,619 | 5/1993 | Inoue | 358/28 X |

Primary Examiner—Mark R. Powell
Attorney, Agent, or Firm—Lerner, David, Littenberg, Krumholz & Mentlik

[57] ABSTRACT

A method and an apparatus for sampling a reference signal so as to generate an error signal indicative of a phase error between an actual sampling phase and a desired sampling phase. The desired sampling phase is displaceable from an optimum sampling phase, so as to facilitate the sampling of an NTSC color burst signal or to effect hue control during sampling of the modulated chroma sub-carrier. The reference signal is sampled at the frequency of said signal and a plurality of said samples are accumulated. After said samples have been accumulated, said accumulation is multiplied by the sine or by the cosine of the phase displacement angle between the optimum sampling phase and the derived sampling phase.

17 Claims, 3 Drawing Sheets

METHOD AND APPARATUS OF SAMPLING A REFERENCE SIGNAL

FIELD OF THE INVENTION

The present invention relates to a digital technique for phase locking analog signals. The invention has particular application in the field of sampling analog composite video signals, in which a luminance signal and a chrominance signal are frequency multiplexed, to produce digital video signals, in accordance with the D2 standard.

BACKGROUND OF THE INVENTION

The D2 standard is a popular format for digitising NTSC and PAL composite video signals. The analog composite video signals are sampled at four times the chrominance sub-carrier frequency, accurately in phase with the I and Q (or u and V in Pal) colour difference signals. In accordance with this standard, the analog line sychronization and color burst signals are removed (and regenerated during digital to analog conversion) therefore during the sampling procedure, it is important to sample the signals at a specified phase with respect to the color sub-carrier. Thus, to effect sampling, the un-modulated chroma sub-carrier signal must be accurately regenerated from the color burst signal.

A known analog phase locked loop for regenerating the un-modulated chroma sub-carrier is shown in FIG. 1. The circuit includes a voltage controlled oscillator 15 which, in addition to generating the sub-carrier signal, also generates a sampling signal at four times the frequency of the sub-carrier. The synthesised sub-carrier signal from the VCO 15 is supplied to a multiplier 16 which receives at its second input, the colour burst signal via a band pass filter 17. Multiplier 16 produces sum and difference signals and the difference signal is supplied to a loop filter 18, via a low pass filter 19 and a gate 20. The gate 20 ensures that only the color burst is allowed to enter the loop and is placed in its open position at all other times, while the loop filter 18 controls the gain of the circuit. Thus, the filtered difference signal, representing the phase error, is supplied to the VCO 15 which in turn provides its output to the multiplier 16, thereby completing the loop.

The chroma sub-carrier may be representated on a phasor diagram, as shown in FIG. 2A. In the phasor of FIG. 2A, the amplitude of the red minus luma (R-Y) signal may be represented by displacement along the positive y axis and the magnitude of the blue minus luma (B-Y) signal may be similarly represented by displacement along the positive x axis. In accordance with convention, the negative B-Y axis is taken to be the zero phase reference, with phase displacements measure clockwise from this reference, putting the R-Y signal at a phase of 90 degrees.

In the circuit shown in FIG. 1, the analog phase locked loop is responsible for generating the sampling signal and any changes to the operating characteristics of the analog components making up said circuit may result in sample phase errors. It is, therefore, advantageous to calculate sample phase after digitisation of the signal, so that the sample phase calculations may be performed after digitisation, wherein the reference burst signal, as well as the modulated picture signal, is also sampled by the analog to digital convertor.

In known phase locking apparatus is shown in FIG. 3, in which substantial portions of the circuit are implemented digitally. The incoming color burst is converted into a sequence of digital samples by an analog to digital converter 31, at four times the frequency of the colour sub-carrier. The sampling signal is produced by a voltage controlled oscillator 32 and it should be noted that the loop frequency of said oscillator is four times the loop frequency of the oscillator 15 in FIG. 1. In addition ADC 31 is also used for sampling the modulated picture data to produce the D2 image samples.

The colour burst signal is transmitted at the reference zero phase as shogun in FIG. 2A and, when locked, sample clocks are produced at zero 90, 180 and 270 degrees per cycle. As shown in FIG. 2B, the zero degrees and the 180 degrees samples should have values of zero when the VCO 32 locks onto the phase of the sub-carrier, irrespective of the amplitude of the burst signal. Thus, in the circuit shown in FIG. 3, the non-zero samples at 90 degrees and 270 degrees may be ignored, for phase locking purposes.

The samples at zero and 180 degrees will have non-zero values when the output signal produced by the VCO 32 is out of phase with the incoming color burst. If the zero degrees sample, say, is positive, due to the sampling frequency lagging the burst signal, the 180 degree sample will be negative. The samples at zero and 180 degrees are therefore supplied to an alternating inverter 33, which inverts the 180 degree samples, such that all of the samples which should occur at the zero crossings have the same polarity. This signal could be supplied directly to the VCO 32 as a control signal, however, it is preferable for the signals to be accumulated throughout the duration of the burst period in an accumulator 35, before being supplied to the VCO 32 via a digital to analogue converter 36 and a loop filter 37, wherein said loop filter 37 is substantially similar to loop filter 18 in FIG. 1. Thus, whenever the output from the digital to analogue converter is non-zero, a correcting error signal is supplied to the VCO 32, thereby bringing the sampling frequency into phase with the burst signal.

In the generation of analog composite video signals, the modulated chroma sub-carrier and the reference burst signal must, to some extent, be processed along different channel paths before being multiplexed for transmission. This may introduce phase errors between the modulated carrier and the burst reference, resulting in hue errors. It is therefore common practice to provide some form of hue control, so as to compensate for the phase error and thereby ensuring that the D2 samples are taken at the correct positions.

The relationship between sample phase and colour burst is further complicated in the NTSC system by the fact that the polar representations of the I and Q axes are displaced from that of the colour burst by 57 degrees. Thus, both the I and Q sample points do not occur at zero crossings of the burst signal, such that the sum of said samples during the burst period is non-zero when the sample phase is correctly locked. This situation, of samples being taken at non-zero crossings with respect to the burst signal, also occurs if the sampling phase must be adjusted to provide hue compensation. Thus, the phase locked loop shown in FIG. 3 operates perfectly well when the samples are required to be in phase with the color burst signal (in PAL systems without hue control) but it will not operate where it is necessary to introduce a phase displacement.

Referring to the circuit shown in FIG. 3, it would be posssible to introduce an offset value, so as to compensate for a phase displacement. For example, accumulator 35 may be loaded with an offset value prior to or subsequent to the accumulation of sample values, such that lock is obtained for sample points displaced along the x axis of the waveform shown in FIG. 2B, away from the zero crossings. However, the burst signal is a purely analogue waveform and may have, within reasonable limits, any absolute magnitude. Thus, as can be appreciated with reference to FIG. 2B, the absolute value of any sample taken at positions other than the zero crossings, will be dependant, not only upon sample phase, but upon the peak to peak magnitude of the chroma burst signal. Thus, any offset value will be dependant, not only upon the phase displacement required but also upon the absolute value of the chroma burst amplitude.

The I and Q axes are displaced from the R-Y and B-Y axes in order to reduce transmission bandwidth. The I axis occupies a position relating to colors to which the eye is most sensitive and conveys frequencies up to 1.5 megahertz. However, the eye is least sensitive to colours that lie around the Q axis, therefore this signal is allocated a reduced bandwidth of 0.5 megahertz above the frequency color of the sub-carrier. Thus, the I signal is displaced from the colour burst signal by a phase of 57 degrees, therefore the technique of relying upon the zero crossings, as illustrated in FIG. 3, cannot be used to achieve sampling at the I and Q positions, unless a phase error is introduced, resulting in the inherent problems of placing reliance upon the absolute amplitude of the color burst signal.

Referring to FIG. 2A, the color burst signal in the NTSC system has zero phase, however, from this a sampling waveform must be produced which is in phase with the I and Q axes, thereby ensuring that the chroma signal is sampled in accordance with the D2 standard.

The Q signal may be considered as being displaced from the positive B-Y axis by a fixed phase displacement angle, P degrees. Similarly, the I axis is displaced by P degrees from the positive R-Y axis. In accordance with the D2 standard, the picture data and therefore the incoming burst, must be sampled at the I and Q positions. However, accurate sample phase adjustment can only be achieved by accumulating values which should be zero, that is along the B-Y axis, thus the B-Y values are calculated and accumulated over the burst period, in order to produce an error signal for controlling the VCO.

As shown in FIG. 2A, the sum of the I and Q phasors has a component in the B-Y axis equal to: Q cos P-I sin P, which may be calculated by a circuit of the type shown in FIG. 4. Thus, in FIG. 4, each I sample is multipled by the sine of the phase error in a multiplier 41, each Q sample is multipled by the cosine of the phase error in a multiplier of 32 and the I component is subtracted from the Q component to produce the B-Y value. The B-Y signals may now be used in a circuit similar to that shown in FIG. 3, in which said signals would be applied to the accumulator 35, given that said signals should have a value of zero when the sampling signal generated by the VCO 32 has the correct phase relationship with the incoming burst signal.

Such an arrangement may also be used for providing a hue control, in which P consists of the selected hue phase adjustment added to the fixed phase adjustment signal of 33 degrees, in order to achieve correct I and Q sampling.

A major problem with the circuit implementation shown in FIG. 4 is that real time multipliers 41 and 42 add significantly to the overall cost of the circuit. Furthermore, although multipliers are commercially available which could operate at video rate, in other applications the speed of operation of the multipliers could become a limiting factor, thereby reducing transmission rate.

SUMMARY OF THE INVENTION

It is an object of the present invention to provide an improved method and apparatus for calculating phase errors. It is a further object of tile present invention to provide an improved circuit for calculating phase errors in a phase locked loop arranged to sample a video signal.

According to a first aspect of the present invention, there is provided a method of calculating phase error, comprising the steps of: sampling a reference signal; accumulating said sample; and multiplying said samples by a coefficient representing a displacement angle, representing a phase displacement between the phase of the reference signal and the optimum sampling position.

Thus, in accordance with said first aspect of the present invention, a number of samples are accumulated before being processed in combination with the phase displacement coefficients, so that said processing does not have to occur in real time on a sample by sample basis. Thus, an advantage of said first aspect of the present invention is that the means for processing samples in combination with the phase displacement coefficience takes place at a speed which is substantially less than the sample rate. When the number of samples accumulated is a multiple of four and alternate inversion occurs, the system effectively provides band pass filtering to remove dc offset and other low frequency components.

DETAILED DESCRIPTION OF THE PREFERRED EMBODIMENTS

Figure 5:
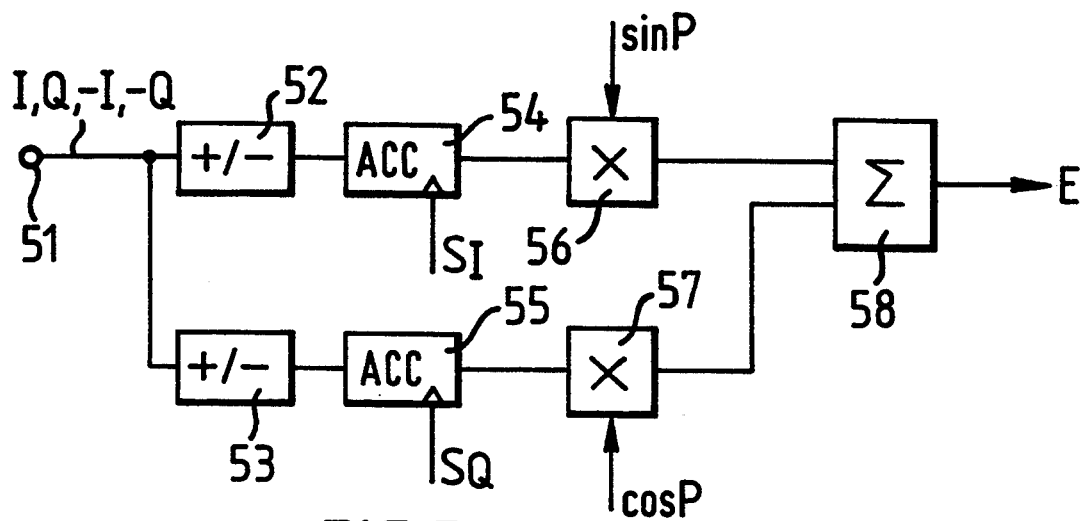
FIG. 5 showns a first embodiment of the present invention, in which samples are accumulated before being multiplied by coefficients; and, FIG. 6 showns a preferred embodiment of the present invention, in which multiplication functions have been replaced by shifting functions which may be implemented in non-real time.

An embodiment of the present invention is shown in FIG. 5 in which, rather than performing the techniques of multiplying (each sample by a coefficient), and then adding the products, the multiplying procedure is simplified by performing the accumulating function first, thereby allowing the multiplication function to be performed on a per burst period rather than on a per sample period.

The sampled chroma signals, four per cycle, are supplied to an input port 51, whereafter I samples are supplied to an alternating inverter 52, while Q samples are supplied to a similar alternating inverter 53. After polarity reversal of alternate samples, the I samples are accumulated in an accumulator 54 with similar accumulation of Q samples in an accumulator 55. Thus, each accumulator accumulates at half the sub-carrier frequency, in response to sampling signals for the I components $S_i$ and sampling signals for the Q components $S_q$, respectively. After the burst period, the accumulated I samples are multiplied by the sine of the in a phase error, in a multiplier 56, while a similar multiplier 57 multiplies the accumulated Q samples by the cosine of the phase error. The products of multipliers 56 and 57 are added together in a sumation circuit 58 to produce a digital error signal E.

Thus, the apparatus of FIG. 5 provides phase detection in a way which sums the signal values at the zero crossing points, thereby allowing an error signal to be produced which tends towards a value of zero as the sampling phase approaches its required value. Samples of like polarity are accumulated prior to being processed in combination with a representation of a phase offset such that, although making use of the zero crossings to achieve an error signal which tends towards zero, the actual position of the sampling may be displaced by said offset. The advantage of performing the accumulation of samples before processing the accumulated value with a representation of the phase offset is that said processing does not have to be performed in real time at the sampling rate. Thus, when sampling a color burst of an encoded colour television signal, the sample phase adjustment processing may be performed during the line period, when picture data is being transmitted, thereby providing significantly more time for the processing to be performed.

In the NTSC system, with I and Q displaced by 33 degrees, multipliers 56 and 57 may be simplified quite substantially when they no longer have to operate in real time. For example, the sine of 33 degrees is very close to the value of $\frac{2}{3}$, therefore the multiplication may be performed using times two and divide by three shifting and adding operations. Similarly, more complex shifting and adding may be performed if a greater level of accuracy is required. Under the control of a programmable central processing unit, the shifting operations performed to effect multiplication may be selected from a large number of possibilities, each representing a particular phase displacement. Thus, in addition to compensating for the 33 degrees offset of the I and Q signals, compensation may also be achieved for phase offset introduced for hue control.

The circuit shown in FIG. 5 satisfies the objects of the present invention by solving problems associated with the known techniques. However, the invention provides for further improvements, particularly given that much of the arithmetic processing may be done at a speed which is much less than the video sample rate. In a preferred embodiment for sampling the color burst signal of composite video, in its conversion to a D2 digital signal, the arithmetic calculations may be performed after the burst samples have been accumulated, during the line scan period consisting of 910 samples. The accumulators 54 and 55 are clocked at half the sample rate, because they each process only the I or Q samples, thus making 455 clock periods available for calculating an error signal before the next line of colour burst is sampled.

Figure 1:
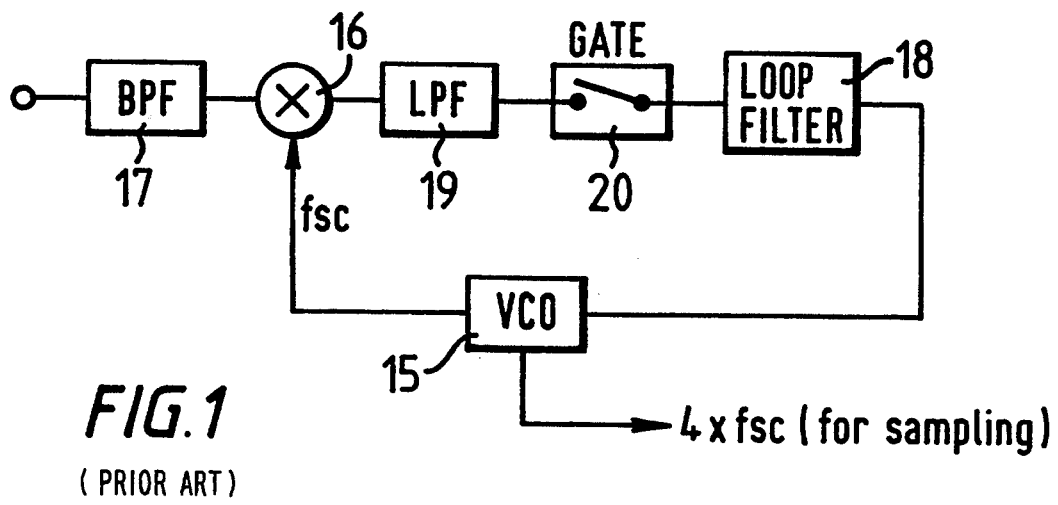
FIG. 1 shows a known analogue phase locked loop for calculating sample phase.
Figure 3:
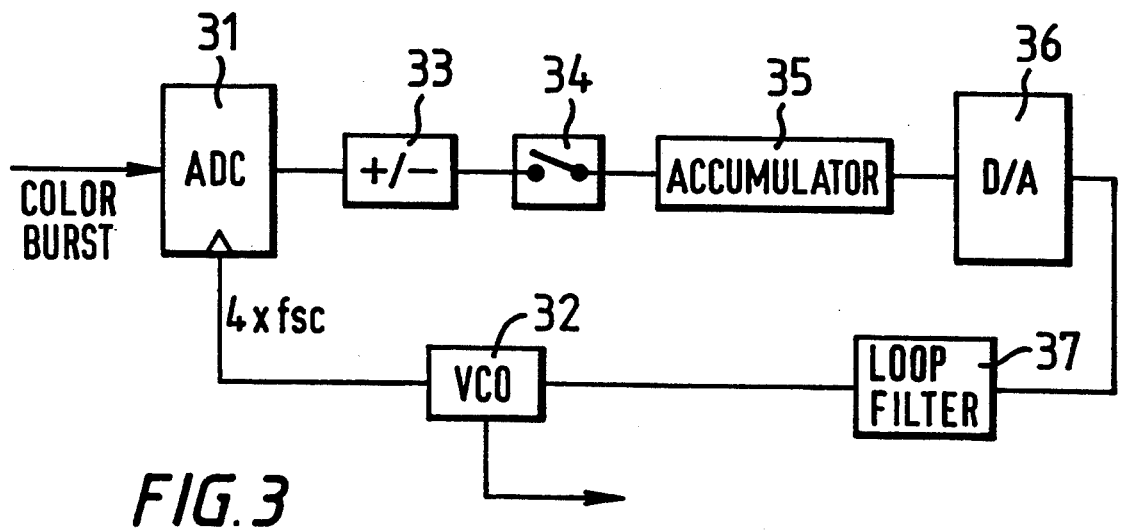
FIG. 3 showns a known digital phase lock locked loop, in which hue compensation is susceptible to amplitude variations of the chroma burst.
Figure 4:
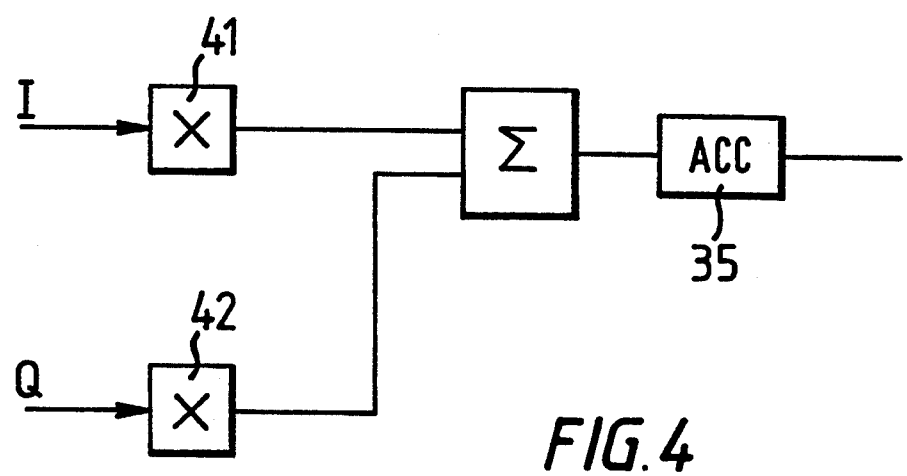
FIG. 4 illustrates the modification to the circuit shown in FIG. 5, in which hue compensation is achieved by multiplying samples by coefficients at the sample rate.
Figure 2A:
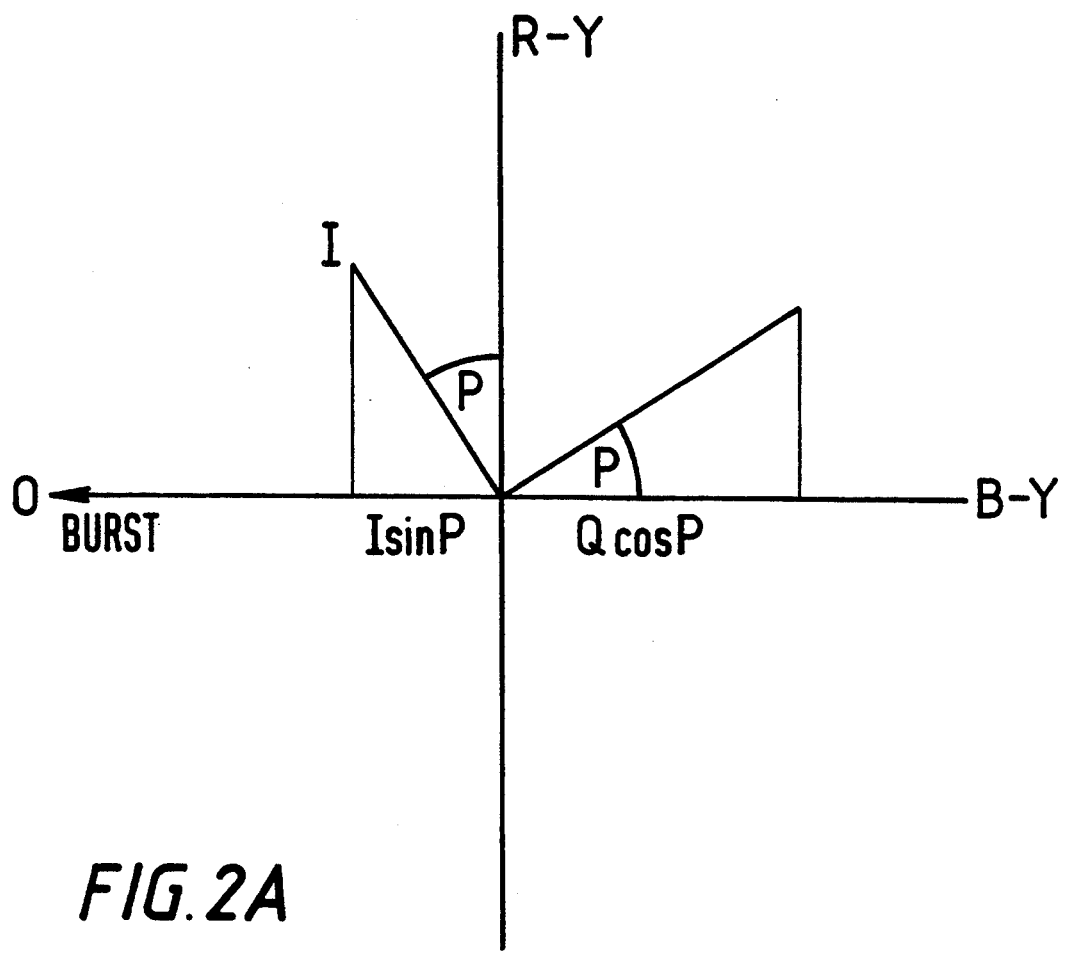
FIG. 2A shows a phasor diagram for the I and Q quadrature components in an NTSC chroma sub-carrier.
Figure 2B:
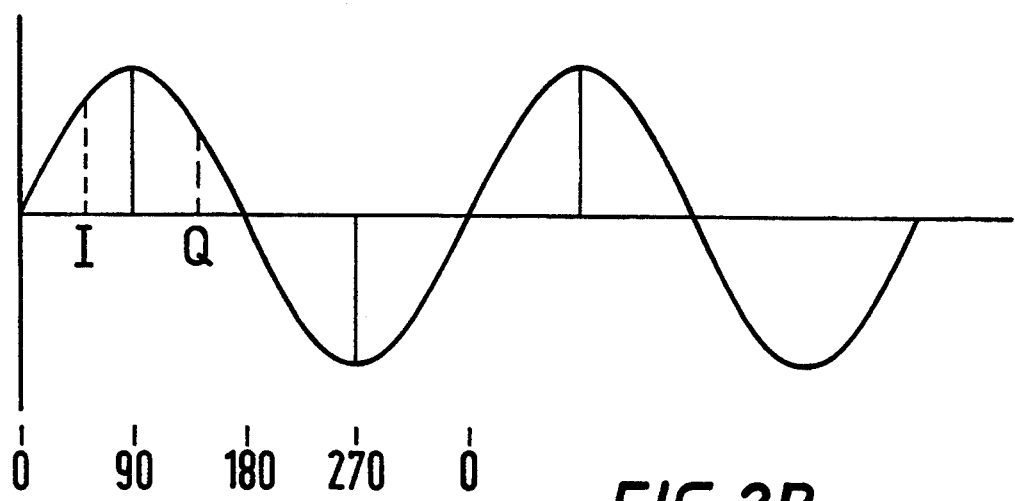
FIG. 2B illustrates a chroma burst signal plotted against time.

In seeking to improve the circuit of FIG. 5 and with particular attention to integrating the digital components of the phase locked loop, two aspects of the circuit identify themselves as elements which would benefit from further modification. Firstly and as previously mentioned, the multipliers 56 and 57 may be replaced by devices for performing less demanding shift and add functions. Secondly, the digital error signal E generated by the sumation circuit 58 would be supplied to the digital to analogue convertor 36 of FIG. 3, to supply an analgoue signal to the voltage controlled oscillator via the loop filter 37. Known digital to analogue convertors are capable of responding well to high frequency signals, however, in the phase locked loop, the loop signal should become constant when locked. This creates problems, firstly because the resolution of the digital convertor may be insufficient, such that the actual analog value required may not be obtainable, in which case it will, at best, dither between the two closest values or, alternatively, it may continually over compensate, causing it to hunt around the optimum value without ever actually locking onto it. Both of these activities are undesirable, as they will result in sample phase jitter at the analog to digital convertor 31. Secondly, noise generated in the loop may also result in undesirable compensation.

The effect of noise may be mitigated substantially if, on achieving phase lock, the output from the digital to analogue convertor 36 is maintained at zero level. However, this optimum operating characteristic is difficult to achieve in practice, due to problems of providing a stable, noise free reference level and of dithering about the optimum value.

Figure 6:
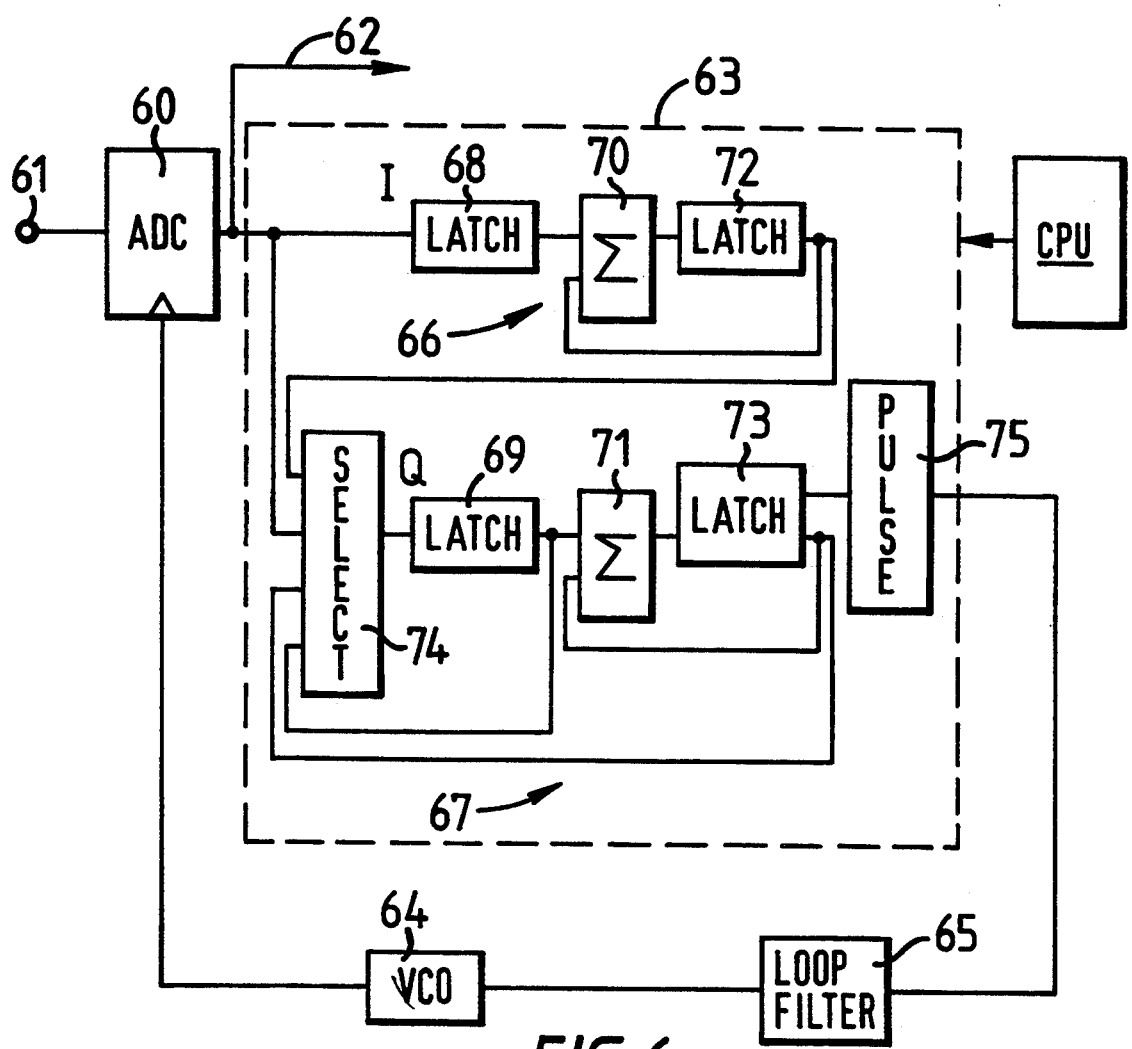

A second embodiment of the present invention is shown in FIG. 6, in which the analogue composite video signal is supplied to an analogue to digital convertor 60 from an input port 61. D2 samples of the image data are supplied to subsequent processing devices over a line 62, which is common to an imput line for a digital burst processor 63. The output from the burst processor 63 is supplied to a voltage controlled oscillator 64 via a loop filter 65, to provide a sampling clock signal for clocking the analogue to digital convertor 60, thereby completing the phase locked loop, at a rate of four times the frequency of the chroma sub-carrier.

The optimium operating characteristic identified above, of producing zero output when no correction is required, is achieved by supplying signals to the loop filter 65 which have only the three possible amplitude levels of positive, negative and zero, the zero level being effectively a high impedance tristate level which is ignored by the loop filter and does not introduce noise into said filter. On achieving lock, the signal supplied to the filter 65 is maintained at zero and in order to advance or retard the voltage controlled oscillator 64, the loop filter 65 is supplied with a positive or negative pulse for each scan line (each burst period) the duration of which, rather than the amplitude, identifying the extent of advancement or retardation required. Averaging of these pulses, to produce a control voltage for the voltage controlled oscillator 64, is performed by the loop filter 65, thus the process of digital to analogue conversion is performed by the combination of the loop filter 65 with the digital burst processor 63.

The zero level, during phase lock, is easily maintained by supplying a signal to the loop filter 65 which is free of positive or negative pulses. Furthermore, resolution is accurately controlled by controlling the duration of each pulse rather than a signal magnitude.

In a preferred embodiment, the digital burst processor 63 is fabricated in the form of an integrated circuit, arranged to receive control commands and data from a programmable central processing unit, CPU. Essential components making up the burst processor 63 are shown in FIG. 6, although it should be appreciated that some of the clock lines and data paths have been omitted, to improve clarity.

During a burst period, four complete burst cycles are supplied to processor 63 at four times the frequency of the chroma sub-carrier. The processor 63 includes a first accumulating region 66 and a second accumulating region 67, each consisting of a first latch 68, 69, a summer 70, 71 and a second latch 72, 73. In addition, the input to latch 69 of the second accumulating region also includes a selector 74, allowing various inputs to be selected. The selector 74 has three inputs, a first received from the output of latch 72, a second received from the input signal and a third being a feedback loop from output of latch 73.

The operation of the digital burst processor 63 may be considered in three stages, firstly, the accumulation of burst samples in real time, secondly, the calculation of a digital error signal and, thirdly, the generation of a pulse width control signal, supplied to the loop filter 65.

Stage 1. During sampling of the burst signal by the analog to digital convertor 60, samples for four complete cycles of the color burst are supplied to the digital burst processor 63. In the burst processor 63, the selector 74 is placed in its second position, such that said samples are supplied simultaneously to latch 68 and to latch 69. Said latches are clocked at half the sampling rate and mutually out of phase, such that I samples are latched in the first accumulating region 66 and Q samples are latched in the second accumulating region 67. After being latched, each value must be accumulated and inverted on alternate latched samples, before the next sample arrives, and to achieve this the accumulated totals are stored in latches 72 and 73, for the I and Q signals respectively and the new latched value is accumulated by shifting bits from the latches 68, 69 to summers 70, 71 while shifting and recirculating bits from the accumulating latches 72, 73. This process is repeated eight times, thereby accumulating a total of 16 samples, with the I samples accumulated in latch 72 and the Q samples accumulated in latch 73. This is the only stage which must operate at a rate consistent with the rate at which samples are supplied to the burst processor 63 and subsequent processing does not have to occur in real time.

Stage 2. Referring to FIG. 5, the completion of stage 1 is equivalent to the accumulation of values in accumulators 54 and 55 and stage 2 consists of multiplying the accumulated I values by the sine of the phase displacement P, multiplying the accumulated Q values by the cosine or said angle P and adding these values together to produce the digital error signal E.

Binary multiplication is performed by shifting and adding and, in this embodiment, the accumulated values will be multiplied by a fractional component, representating the sine or the cosine of the angle P. Given the clock rate at which processor 63 is arranged to operate and the periods available between each burst, the processor is simplified by arranging for only the second accumulating region 67 to perform the multiplication functions by the shifting and adding technique.

The number accumulated in latch 73 becomes the Q operand which is multiplied by a coeffecient from the CPU representing the cosine of the phase angle P. The Q operand is transferred from latch 73 via the selector 74 to latch 69. The first bit of the coefficent supplied from the CPU is considered and if said bit is a logical 1 the value in latch 69 is supplied to the recently cleared latch 73 via adder 71. The value in latch 69 is divided by 2 by shifting it through selector 74. The next bit of the coefficient is then considered and the shifted value added to the value stored in latch 73, by means of summer 71 if said value is set to logic 1. If the value is set to logic zero, no action is taken. This procedure is repeated, i.e. shifting and adding, for each bit of the coefficient supplied by the CPU. At this point, the value accumulated in latch 73 is equal to the output of multiplier 57 in FIG. 5.

The next step is for the value in latch 69 to be cleared and to be replaced by the value stored in latch 72 via selector 74. The shifting and adding procedure is now repeated for the sine P coefficient supplied by the CPU such that, after performing shift and add operations for each bit of the coefficient, the error signal E will have accumulated in latch 73. It should be noted, that a value equivalent to the output from multiplier 56 is not generated independently and then added to the output from multiplier 57 because the accumulation occurs as an ongoing process within latch 73.

Stage 3. The error signal resident in latch 73 may be negative or positive, which is identified by a sign bit. The value of this sign bit is supplied to a pulse generating circuit 75, which in turn provides an output to the loop filter 65.

If the value accumulated in latch 73 at the end of stage 2 is positive, a positive pulse is generated by the pulse generator 75 and if said sign is negative a negative pulse is generated by said generator. A pulse generated by generator 75 is given a duration by decrementing the latch 73, in response to control signals from the processing unit 74. The rate at which said accumulated value is decremented may be adjusted so as to control the sensitivity of the circuit and, preferably, it should be emperically determined to provide optimum operating performance. Thus, for example, the values stored in the latch 73 may be decremented by substracting a value of three for each clock and the pulse generating circuit 75 is arranged to maintain its output until the latch 73 has counted down to zero, which is identified by the sign signals supplied to said circuit changing state. Thus, the pulse generating circuit 75 responds initially to the status of the sign signal and thereafter responds to a changing status on said line.

The pulse generating circuit 75 has a degree of delay associated therewith, such that only if one decrementing action is required to effect a change of state, the circuit is assumed to have locked and neither a positive pulse nor a negative pulse is generated, such that the output from the first processor 63 is maintained at its tristate zero level, thereby not influencing the status of the loop filter 65. Thus, on lock, a true zero level is supplied to the loop filter 65, while fine adjustments may be made to phase by decrementing latch 73 to adjust the duration of negative or positive pulses supplied to the loop filter 65.

When used for converting analog signals to digital D2 signals, the line synchronisation and color burst signals are removed and replaced by their digital equivalents.

What we claim is:

1. A method of sampling a reference signal so as to generate an error signal indicative of a phase error between an actual sampling phase and a desired sampling phase, wherein said desired sampling phase is displaceable from an optimum sampling phase, comprising the steps of:

sampling the reference signal at the frequency of said reference signal;

accumulating a plurality of said samples; and periodically multiplying said accumulation of samples by a coefficient derived as a function of the phase displacement between the optimum sampling phase and the derived sampling phase.

2. A method according to claim 1, wherein the reference signal is sampled at twice the frequency of said signal mutually displaced by 180 degrees, and alternate samples are inverted before being accumulated.

3. A method according to claim 2, further comprising accumulating a second set of samples displaced by 90 degrees from the aforementioned accumulated samples.

4. A method according to claim 1, wherein said function of said phase displacement is the sine of said phase displacement or the cosine of said displacement.

5. A method according to claim 1, wherein said samples are accumulated by a sequence of shifting operations.

6. A method according to claim 1, wherein said multiplication is performed by a sequence of add and shift operations.

7. Apparatus for sampling a reference signal so as to generate an error signal indicative of phase error between an actual sampling phase and a desired sampling phase, wherein said desired sampling phase is displaceable from an optimum sampling phase, comprising:

sampling means for sampling the reference signal at the frequency of said reference signal;

accumulating means for accumulating a plurality of said samples; and multiplying means for periodically multiplying said accumulation of samples by a coefficient derived as a function of the phase displacement between the optimum sampling phase and the desired sampling phase.

8. Apparatus according to claim 7, wherein the reference signal is sampled at twice the frequency of said signal, and including inverting means for inverting alternate ones of said samples.

9. Apparatus according to claim 7, including a second accumulation means arranged to accumulate samples displaced by 90 degrees from said samples.

10. Apparatus according to claim 9, including means for multiplying said first accumulation of samples by the cosine of said phase displacement and means for multiplying said second accumulation of samples by the sine of said displacement.

11. Apparatus according to claim 7, including means for shifting and adding bits, to effect the multiplication of said accumulated samples.

12. Apparatus according to claim 7, including oscillating means and means for controlling said oscillating means in response to said error signal, wherein an output from said oscillating means provides a clocking signal to said sampling means.

13. Apparatus according to claim 12, including pulse width conversion means for converting the error signal into a pulse having a duration determined by the value of said error signal.

14. Apparatus according to claim 13, including line filtering means for receiving pulses from said pulse width conversion means for controlling said oscillating means.

15. Apparatus according to claim 7, wherein said reference signal is a video color burst signal.

16. Apparatus according to claim 15, wherein said color burst signal is the color burst signal under the NTSC color video system and said desired sampling phase is displaced from said optimum sampling phase by fifty seven degrees.

17. Apparatus according to claim 15, wherein said desired sampling phase is displaceable from an optimum sampling phase in order to effect hue control.

* * * * *